(12) United States Patent
Hübner et al.

(10) Patent No.: US 11,391,772 B2
(45) Date of Patent: Jul. 19, 2022

(54) SIGNAL TRANSMISSION SYSTEM

(71) Applicant: Gesellschaft für Gerätebau mbH, Dortmund (DE)

(72) Inventors: Hans-Jörg Hübner, Dortmund (DE); Frank Böttger, Dortmund (DE); Erik Buck, Dortmund (DE)

(73) Assignee: GESELLSCHAFT FÜR GERÄTEBAU MBH, Dortmund (DE)

( * ) Notice: Subject to any disclaimer, the term of this patent is extended or adjusted under 35 U.S.C. 154(b) by 70 days.

(21) Appl. No.: 16/944,264

(22) Filed: Jul. 31, 2020

(65) Prior Publication Data

US 2021/0033664 A1 Feb. 4, 2021

(30) Foreign Application Priority Data

Aug. 2, 2019 (DE) .................... 10 2019 120 918.8

(51) Int. Cl.
 *G01R 31/28* (2006.01)
(52) U.S. Cl.
 CPC ..... *G01R 31/2879* (2013.01); *G01R 31/2856* (2013.01); *G01R 31/2881* (2013.01)
(58) Field of Classification Search
 CPC ............................................... G01R 31/31924
 See application file for complete search history.

(56) References Cited

U.S. PATENT DOCUMENTS

| 4,203,090 A | * | 5/1980 | Adamson ............ G01F 23/0007 |
| | | | 340/10.41 |
| 6,734,793 B1 | | 5/2004 | Dreyer et al. |
| 9,276,393 B2 | * | 3/2016 | Ostrovsky .............. H02H 3/335 |
| 10,379,145 B2 | | 8/2019 | Simon et al. |
| 2011/0148511 A1 | | 6/2011 | Seiler et al. |
| 2016/0371212 A1 | | 12/2016 | Griesbaum |
| 2018/0107184 A1 | | 4/2018 | Bihler |
| 2020/0159179 A1 | | 5/2020 | Bihler et al. |

* cited by examiner

*Primary Examiner* — Tung X Nguyen
(74) *Attorney, Agent, or Firm* — David S. Safran; Roberts Calderon Safran & Cole, P.C.

(57) ABSTRACT

A signal transmission system with at least one signal encoder, a line, and a control and evaluation unit, wherein the signal encoder has an electronic unit and a power source, wherein the signal encoder feeds an imprinted current in the range between a preset first value and a preset second value into the line, in particular between 4 and 20 mA. The control and evaluation unit has a load and a microprocessor, and captures and evaluates a voltage that decreases via the load or a current that flows through the load. Additional information regarding the status of the components, can thus be captured and forwarded in a simple way, in that the load in the control and evaluation unit is connected in series to at least one electrical component at which a direct current appears when a current flows through the electrical component.

18 Claims, 2 Drawing Sheets

SIGNAL TRANSMISSION SYSTEM

BACKGROUND OF THE INVENTION

Field of the Invention

The invention relates to a signal transmission system with at least one signal encoder, a line, and a control and evaluation unit, wherein the signal encoder has an electronic unit and a power source and feeds into the line an imprinted current in the range between a preset first value and a preset second value, in particular between 4 and 20 mA. The control and evaluation unit has a load and a microprocessor and captures the voltage that decreases via the load. Moreover, the invention also relates to a transducer and an evaluation unit for a corresponding signal transmission system.

Description of the Related Art

The signal transmission systems are used, in particular, in process-control engineering and systems engineering for transmitting process values from various sites to a monitoring and control site, which is centrally located in most cases. For this purpose, corresponding signal encoders, for example located at or near corresponding machines or units, are positioned on site. The signal encoder can be, for example, a transducer, which then has at least one sensor for capturing a measured value. In addition, this can be the signal encoder, but, for example, also a data collector, a display unit, or an actuator, which can also transmit a value over the line to the control and evaluation unit. Hereinafter, a transducer is referred to as a signal encoder in most cases, without the invention having to be limited thereto.

Using a corresponding sensor, a transducer captures the respective measured value, which optionally after a corresponding amplification and normalization is then transmitted over a line to the control and evaluation unit that is arranged remotely. The measured value to be captured can be, for example, a temperature, a pressure, a gas concentration, or a medium speed. In principle, a transducer can be assigned specifically to a control and evaluation unit. In general, the control and evaluation units are designed in such a way, however, that multiple—for example four, eight, sixteen or else more—transducers or signal encoders, which can be configured and monitored via the control and evaluation unit, can be connected to the latter. As a result, measured values that are determined at different sites, some of which are difficult to access or are far apart, can be monitored and displayed centrally at one site.

In existing units, analog-transmitting transducers are frequently used that in most cases are connected to the control and evaluation unit in a star configuration. In this case, measured-value transmission by means of an imprinted direct current in the range of 4 to 20 mA has for years in practice established itself de facto as one type of standard for the transmission of analog measured values from the transducer over a line to a control and evaluation unit. As a result, an analog measured value can be transmitted continuously, so that even in the case of multiple transducers connected to a control and evaluation unit, the current measured value of any individual transducer can always be accessed or displayed at the control and evaluation unit.

The connection of the individual transducer to the control and evaluation unit is in this case in general accomplished with a two-wire or three-wire line. The use of three-wire lines in this case has the advantage that two wires can be used to supply power to the transducer, while the imprinted current that corresponds to the measured value is transmitted via the third wire. Based on the normalization, the minimum measured value of a preset measurement range corresponds to a current of 4 mA transmitted over the line, and the maximum measured value corresponds to a current of 20 mA. As a result, it is possible both to monitor for open circuits (current=0 mA) and for values exceeding the measurement range (current>20 mA). In both cases, the evaluation electronics of the control and evaluation unit knows that the incoming current value cannot be evaluated and displayed as a measured value that actually exists.

Even though this measured value transmission by means of an imprinted current has worked well for many years because of its reliability and its very low susceptibility to electromagnetic noise, it is also, however, associated with the drawback that, other than the actual measured value and the two above-mentioned error conditions, almost no other information can be transmitted. Moreover, the transmission of the information is possible only in one direction, namely from the transducer to the control and evaluation unit. For guaranteed transmission, in addition, it is frequently desirable to have additional error detections for components or their connections.

Both drawbacks can be eliminated in such a way that instead of analog-transmitting transducers, digital-transmitting transducers are used, which in general are connected not via a two-wire or three-wire star configuration, but rather via a four-wire bus wiring by means of individual strands or a ring to the control and evaluation unit. This solution can be adapted without any problem when new units are built, but in existing units, an exchange of all components is necessary, i.e., all transducers, control and evaluation units, and in particular all lines, which is connected not only to a very high cost expenditure but rather in general also makes necessary a longer interruption of the ongoing processes. For this reason, in the case of existing units, a complete replacement of the signal transmission system in general is not considered.

SUMMARY OF THE INVENTION

The object of this invention is therefore to further develop the signal transmission system as described in the beginning in such a way that additional information can be captured and forwarded as simply as possible via the signal transmission system or its components. The replacement of a component, for example, a control and evaluation unit, does not have to mean that other components, for example, individual signal encoders or individual lines, necessarily must be replaced as well.

This object is achieved in the signal transmission system as described in the beginning with the features of Claim 1. In the case of the signal transmission system according to the invention, at least one electrical component is connected in series to the load in the control and evaluation unit, at which component a direct voltage appears when a current flows through the electrical component. In this case, the microprocessor determines the voltage that decreases via the load in the two states of the switch, compares the voltages to one another, and detects an error when a threshold is exceeded or fallen below, thereby initiating the output of a corresponding error message. The microprocessor thus determines both the voltage U1 that decreases via the load when the electrical component is bridged and the voltage U2 that decreases via the load when the electrical component is connected in series to the load. Instead of the respective voltage that decreases via the load, the current that flows through the load can also be measured. In both cases, it is possible to determine the voltage that decreases via the load and thus also a corresponding comparison of the two voltages.

With the term electrical component, reference is made in the most general sense to a component at which a direct voltage appears when a current flows through the electrical component. The component can be not only an individual building element but also multiple individual building elements, which are interconnected, for example connected in series electrically to one another. In the simplest case, the electrical component can be a resistor. As an electrical component, for example, a diode or a series circuit that consists of a resistor and a diode can also be provided.

Since, in the case of the signal transmission system, an imprinted current is fed from the transducer into the line, the current is also kept constant by the power source of the transducer in the normal case even if the input resistance on the control and evaluation unit, which is determined by the load and the electrical component, and thus the load behavior on the line are changed by the connection of the electrical component in the control and evaluation unit. The active load change performed by the connection of the electrical component is thus regulated in the normal case by the power source in the transducer, so that the current that flows through the load into the control and evaluation unit is independent of whether the electrical component is connected in series to the load or not. The voltage U1 that decreases via the load when the electrical component is bridged should correspond essentially to the voltage U2 that decreases via the load when the electrical component is connected in series to the load. If this is not the case or the difference between the two voltages exceeds a preset threshold, the latter is detected by the microprocessor as an error and a corresponding error message is output. An error can consist in the fact that, for example, the transducer itself is defective or there is faulty wiring.

The above-described measure according to the invention, namely to arrange an electrical component in the control and evaluation unit in such a way that the latter can be connected in series to the load or bridged by means of a switch, represents an effective but very simple circuitry measure in order to determine an error in the signal transmission system. In this case, this measure also in particular does not require that existing analog-transmitting transducers have to be exchanged and replaced by digital-transmitting transducers. Nor do already installed lines between the individual transducers and the control and evaluation unit have to be exchanged.

If the load of the control and evaluation unit is referred to as a burden, a burden changeover is accomplished by arranging the electrical component and the switch in a simple way. The resistance value of the load and the resistance value of the electrical component are in this case preferably in the same order of magnitude. In particular, the resistance value of the load can correspond essentially to the resistance value of an additional resistor that is used as an electrical component or can deviate only slightly from the latter.

According to an advantageous configuration of the signal transmission system according to the invention, the switching of the switch in the control and evaluation unit is carried out in a clocked manner, wherein the clock represents a preset serial data stream or corresponds to the latter. The above-described burden changeover is then accomplished in a clocked manner corresponding to a serial data stream, which can be used to transmit data from the control and evaluation unit to the signal encoder. A change in voltage is superimposed on the constant current that is fed into the line by the clocked changeover of the switch, which voltage change can be detected by having the signal encoder of the latter be configured accordingly. The control of the switch, with which the electrical component is connected in series to the load or bridged, is carried out preferably by the microprocessor that is arranged in the control and evaluation unit.

In another especially preferred configuration of the signal transmission system according to the invention, the signal encoder is designed so that it can detect and evaluate the serial data stream that is superimposed on the constant current that is transmitted over the line by the control and evaluation unit. For this purpose, the signal encoder has a comparator, wherein an input of the comparator is connected to the line. As a result, a serial data stream can be generated in a simple way from the voltage change queued up on the line, which change is caused by the clocked switching of the switch in the control and evaluation unit, which data stream corresponds to the serial data stream with which the switch of the switch in the control and evaluation unit is clocked. A Schmitt trigger can be downstream from the comparator, which trigger is then connected to the output of the comparator and generates a hysteresis in order to generate a clear binary signal from the analog input signal.

Because of the above-described clocking of the switch in the control and evaluation unit and the above-described configuration of the transducer with a comparator, it has thus been made possible to transmit information in the form of serial data from the control and evaluation unit to the transducer and to receive these serial data from the transducer without an already installed line here; for example, a two-wire or three-wire line has to be replaced by a special bus line.

In the case of the above-described configuration of the transducer, the latter preferably has a microprocessor, which is connected to the output of the comparator or to the output of the Schmitt trigger when a Schmitt trigger is present downstream from the comparator. Using the microprocessor, the captured serial data stream can be examined for credibility, and thus transmission errors can be detected. In addition, an evaluation of the received data stream can be carried out in the microprocessor.

According to another, especially preferred configuration of the signal transmission system, the signal encoder is configured in addition so that besides the actual measured value, serial data can also be transmitted from the signal encoder over the line to the control and evaluation unit. For this purpose, the signal encoder preferably has a mixer, in which a clocked signal is superimposed on the measured value to be transmitted, which signal represents the serial data stream. A modulated stream is then fed from the signal encoder into the line, which is modulated in amplitude. In addition, the carrier amplitude can be proportional to the measured value that is to be transmitted, i.e., preferably between 4 and 20 mA. Due to the superimposition of the clocked signal, the latter is slightly changed in the clock of the serial data stream, so that the forwarding of the measured value over the line is impaired by the amplitude modulation only during data transmission.

To capture and evaluate the data that is transmitted from the signal encoder over the line, the control and evaluation unit according to another advantageous configuration of the signal transmission system according to the invention also has a comparator, wherein an input of the comparator is connected to the line. The one input of the comparator is in this case connected in particular to the connection point between the load and the electrical component. By using a comparator, in turn in a simple way, the data signal that is modulated onto the constant current can be detected and evaluated. From the pulsing voltage in the clock of the data stream, which voltage decreases via the load, the serial data stream that is modulated onto the current by the signal encoder can thus be restored using the comparator.

In this case, in turn, a Schmitt trigger can be downstream from the comparator, which Schmitt trigger is thus connected to the output of the comparator. Also, in this connection, a microprocessor is preferably connected to the output of the comparator or the Schmitt trigger in order to examine the evaluated data stream for credibility and thus to detect possible transmission errors.

The above-described signal transmission system according to the invention makes it possible in a simple and flexible way to modernize an existing signal transmission system, wherein existing lines can be further used. In a first step, an existing control and evaluation unit can be replaced and modified corresponding to the invention. In addition, the already present analog-transmitting transducers or alternate and successive new transducers, which can forward and receive additional data, can be connected to the latter.

As has already been explained in the beginning, in addition to the above signal transmission system described in detail, the invention also relates to a transducer and a control and evaluation unit for such a signal transmission system. Relative to the configuration of the transducer according to the invention, reference is made to claim 11. According to the invention, besides at least one sensor, an electronic unit, and a power source, the transducer in addition also has a comparator, wherein an input of the comparator is connected to the output connector, on which the imprinted current is available. A serial data stream can thus be derived from a pulsing voltage that is queued up on the output connector.

According to a preferred configuration of the transducer, the latter has a mixer, by means of which a clocked signal is superimposed on the measured value that is captured by the sensor, which signal represents a serial data stream, so that an amplitude-modulated current is available at the output connector of the transducer. In this way, additional information, in addition to the actual measured value, can be forwarded from the transducer over the line to a control and evaluation unit, so that, for example, information on the remaining service life of a worn sensor of the transducer can be evaluated. As a result, an imminent defect can be detected in time, and appropriate repair measures can be initiated. Overall, down times can be minimized and thus increase the operating time and the productivity of a unit.

According to one feature, the control and evaluation unit according to the invention is wherein in addition to a load that is connected to a signal input and a microprocessor, it has at least one electrical component and a switch, wherein the resistor is connected in series to the load and optionally can be bridged by means of the switch. In this case, the microprocessor determines the voltage that decreases via the load both for the case that the electrical component is connected in series to the load and also for the case that the electrical component is bridged. A comparison of the two voltages shows that the difference between the two voltages exceeds a threshold, thus an error is detected by the control and evaluation unit, which error can then be output accordingly. Such an error message can in this case be issued optically, acoustically, and/or electrically.

According to a preferred configuration of the control and evaluation unit, the latter in addition has a comparator and preferably also a Schmitt trigger, wherein an input of the comparator is connected to the connection point between the load and the electrical component, and the Schmitt trigger is connected to the output of the comparator. Preferably, moreover, the microprocessor is connected to the output of the Schmitt trigger.

In particular, there are multiple options for configuring and further developing the signal transmission system according to the invention, the transducer, and the control and evaluation unit. To this end, reference is made to the following description of preferred embodiments in connection with the accompanying drawings.

DETAILED DESCRIPTION OF THE DRAWINGS

Figure 1:
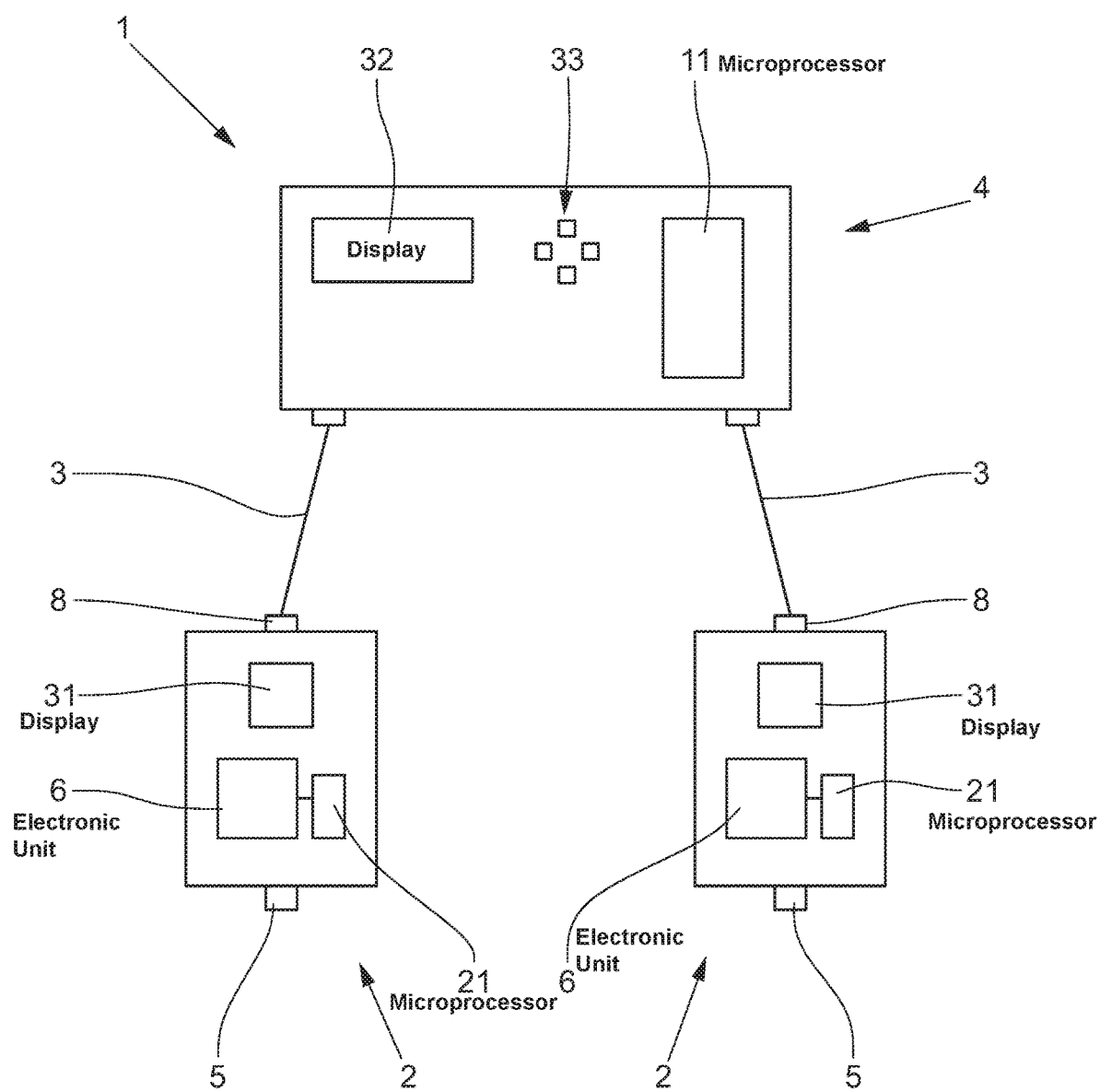
FIG. 1 shows a simplified block diagram of a signal transmission system, with two transducers and a control and evaluation unit.

In a diagrammatic depiction, FIG. 1 shows how the signal transmission system 1 can be designed. Depicted are two transducers 2, which, like multiple other transducers, not depicted, are connected in each case via a line 3 to a control and evaluation unit 4. The individual transducers 2 in each case have at least one sensor 5, which can measure various physical values depending on the configuration.

The signal transmission system 1 is, for example, a gas warning unit; thus, the individual transducers 2 have sensors 5 that can measure the concentration of combustible, toxic gases or oxygen. In the case of such a gas warning unit, the control and evaluation unit 4 is frequently also referred to as a gas warning control center. The connection of the individual transducers 2 to the control and evaluation unit 4 in this case is carried out in general with three-wire lines 3, wherein two wires are used to supply power to the transducer 2, and the third wire is used to transmit the captured measured value. The measured value that was captured by the sensor 5 of a transducer 2, i.e., for example, a specific gas concentration, is converted into an imprinted direct current in the range of 4 to 20 mA using an electronic unit 6 provided in the transducer 2 and a power source 7, wherein in general, 4 mA corresponds to the minimum value, and 20 mA corresponds to the maximum value of a specific adjustable measurement range. A reversed assignment is also conceivable, so that 4 mA corresponds to the maximum value, and 20 mA corresponds to the minimum value of a specific, adjustable measurement range.

Figure 2:
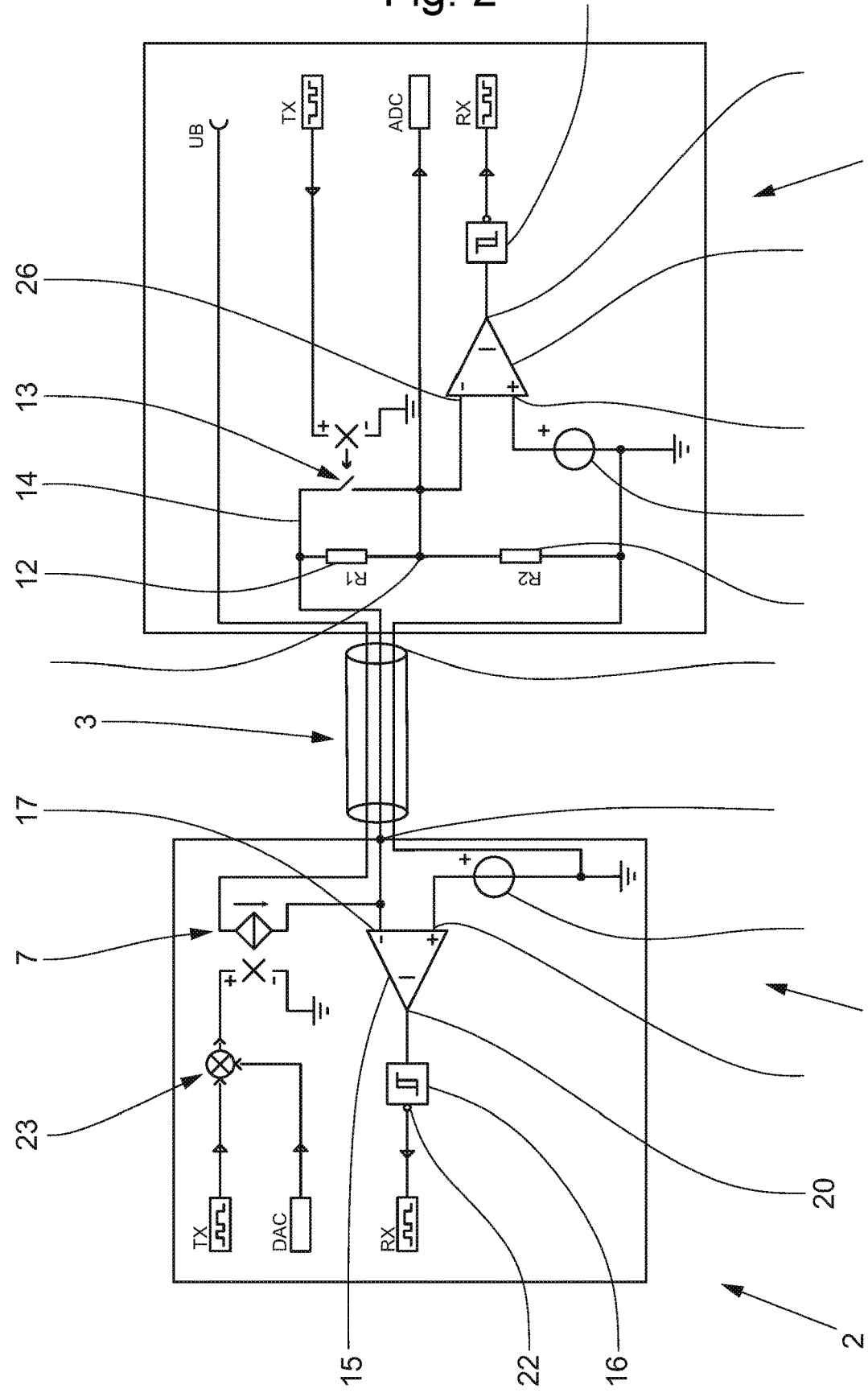
FIG. 2 shows a simplified block diagram of the signal transmission system according to the invention.

From the simplified diagram of the signal transmission system 1 depicted in FIG. 2, it is evident that the power source 7 in the transducer 2 is connected via an output connector 8 to a wire of the line 3, namely the above-mentioned third wire, via which the imprinted direct current that represents the measured value is transmitted. On the other end of the line 3, this wire is connected to a signal input 9 of the control and evaluation unit 4. The control and evaluation unit 4 has a load 10, which is connected to the signal input 9 in such a way that the current that is transmitted via the third wire of the line 3 flows through the load 10. Using an analog-digital converter in the microprocessor 11, the voltage that decreases via the load 10 can be captured and evaluated.

In the case of the signal transmission system 1 according to the invention or the control and evaluation unit 4 according to the invention, in addition to the load 10, an electrical component, in particular another resistor 12, is also provided, which is connected in series to the load 10, wherein it is arranged between the signal input 9 and the load 10. In addition, a switch 13 is provided, by means of which the additional resistor 12 can be bridged. To this end, the switch 13 is arranged in a bridging branch 14 that is provided parallel to the additional resistor 12. Instead of only one resistor 12 as an electrical component, for example, a series circuit consisting of a resistor and a diode—not shown here—can also be connected in series to the load 10.

Since, in the case of the signal transmission system 1, an imprinted current is fed from the transducer 2 into the line 3, and is kept constant by the power source 7 of the current that flows through the load 10, regardless of whether the additional resistor 12 is bridged in the case of a closed switch 13, or is in series to the load 10 in the case of an open switch 13. By connecting or bridging the additional resistor 12, an active load change is made in the control and evaluation unit 4; in the normal case, however, this load change should not result in a change of the current that flows through the line 3 and thus also through the load 10, since the load change is regulated by the power source 7.

If the current that flows through the load 10 or the voltage that decreases via the load 10 is now measured by the microprocessor 11 of the control and evaluation unit 4 both in the case of an open switch 13 and in the case of a closed switch 13, an error in the signal transmission system 1 can be detected from a comparison of the two voltages or currents. An error can consist in that, for example, the transducer 2 or its power source 7 is defective, or there is faulty wiring, or there is a defect on the line 3. Because of the above-described measure, optionally to bridge the additional resistor 12 or to connect in series to the load 10, it is possible to detect errors in the control and evaluation unit 4 at very little cost in circuitry.

In the preferred embodiment of the signal transmission system 1 that is depicted in FIG. 2, the switch 13 is not opened or closed only for performing the above-described error detection, but rather the switch 13 is also used to transmit data from the control and evaluation unit 4 to the transducer 2. For this purpose, the switching of the switch 13 is carried out in a clocked manner, wherein the clock represents a preset serial data stream. In this way, a voltage change is superimposed on the constant current that is fed into the line 3, which voltage change can also be detected in the transducer 2. To this end, the transducer 2 has a comparator 15 and a Schmitt trigger 16, wherein an input 17 of the comparator 15 is connected to the line 3 and the other input 18 is connected to a reference potential 19. The output 20 of the comparator 15 is connected to the Schmitt trigger 16, so that a serial data stream and thus information from the transducer 2 that is sent out from the control and evaluation unit 4 can be received from the voltage change that is queued up on the line 3, which voltage change is caused by the clocked switching of the switch 13 in the control and evaluation unit 4. To evaluate the received serial data stream, the transducer 2 also has a microprocessor 21, which in addition can be used to examine the received serial data stream for credibility. For this purpose, the microprocessor 21 is connected to the output 22 of the Schmitt trigger 16.

In order to be able to transmit additional information also from the transducer 2 to the control and evaluation unit 4 in addition to the measured value, the transducer 2 has a mixer 23, by means of which a clocked signal is superimposed on the measured value that is captured by the sensor 5, which signal represents a serial data stream, so that a modulated current is fed into the line 3. The current that is fed into the line 3 is then amplitude-modulated, wherein the carrier amplitude is determined by the measured value that is measured by the sensor 5, i.e., is preferably between 4 and 20 mA.

In addition to the actual measured value, the information from the transducer that is transmitted over the line 3 in this way and that can contain, for example, a report on the remaining service life of the sensor 5 is detected in the control and evaluation unit 4 in such a way that the latter has a comparator 24 that in this case is also present downstream from a Schmitt trigger 25. An input 26 of the comparator 24 is connected to the connecting point 27 between the load 10 and the additional resistor 12, while the other input 28 is connected to a reference potential 29. The output 30 of the comparator 24 is connected to the Schmitt trigger 25, which is connected to an input of the microprocessor 11.

The data signal that is modulated onto the constant current can be detected and evaluated in a simple way by using a comparator 24 as well as the above-described circuitry. Thus, additional information that is modulated by the transducer 2 onto the actual measured value can also be received by the control and evaluation unit 4.

FIG. 1 also shows a diagrammatic depiction of the transducer 2 and the control and evaluation unit 4. In addition to the sensor 5, the electronic unit 6 and the microprocessor 21 are depicted with the transducer 2. Moreover, it is also indicated that the transducer 2 has a display 31, via which the measured value that is measured can also be shown on site. The additional above-described essentially electronic components of the transducer 2, such as the power source 7, the comparator 15, and the mixer 23, are depicted in the simplified diagram according to FIG. 2.

Correspondingly, in the case of the control and evaluation unit 4, individual electronic building elements are also depicted only in FIG. 2 and not in FIG. 1. In the block diagram according to FIG. 1, however, the microprocessor 11, not depicted in FIG. 2, is indicated, with which both the switch 13 is switched and the serial data signal that is received via the comparator 24 and the Schmitt trigger 25 is evaluated. Moreover, the control and evaluation unit 4 also has a display 32 and multiple control keys 33, with which the individual measured values of the individual transducer 2 can be selected.

If the control and evaluation unit 4 is designed to connect multiple transducers 2, as is indicated in FIG. 1, the circuit that is depicted in FIG. 2 is correspondingly equipped with the load 10, the additional resistor 12, and the switch 13 for each signal input 9. Also, the comparator 24 can correspondingly be provided for each signal input 9. As an alternative, however, it is also possible to provide only one comparator, which can be connected via a corresponding switch optionally to respectively one signal input 9 or a connecting point 27.

What is claimed is:
1. A signal transmission system, comprising:
at least one signal encoder,
a line, and
a control and evaluation unit,
wherein the signal encoder has an electronic unit and a power source,
wherein the control and evaluation unit has a load and a microprocessor,
wherein the signal encoder feeds an impressed current in a range between a preset first value and a preset second value into the line, and wherein a voltage that drops across the load or a current that flows through the load is captured and evaluated in the control and evaluation unit, wherein at least one electrical component is connected in series to the load in the control and evaluation unit, at which at least one electrical component a direct voltage drop appears when a current flows through the electrical component, wherein the at least one electrical component is bridgeable by a switch, and wherein a microprocessor compares a first voltage that drops across the load or the current that flows through the load when the electrical component is bridged to a second voltage that drops across the load or the current that flows through the load when the electrical component is connected in series to the load, and detects an error when a threshold is exceeded or fallen below.

2. The signal transmission system according to claim 1, wherein the signal encoder is a transducer and in addition has at least one sensor for capturing a measured value, and wherein the current that is fed into the line is proportional to the captured measured value.

3. The signal transmission system according to claim 1, wherein the electrical component is a resistor, a diode, or a series connection of a resistor and a diode.

4. The signal transmission system according to claim 1, wherein switching of the switch in the control and evaluation unit is carried out in a clocked manner, wherein the clock represents a preset serial data stream.

5. The signal transmission system according to claim 4, wherein the switch is controlled by the microprocessor.

6. The signal transmission system according to claim 4, wherein the signal encoder has a comparator, wherein an input of the comparator is connected to the line, so that the serial data stream is captured from a voltage change impressed on the line, which change is caused by clocked switching of the switch in the control and evaluation unit.

7. The signal transmission system according to claim 6, wherein the signal encoder has a second microprocessor, which is connected to the output of the comparator or the output of a Schmitt trigger that is downstream from the comparator.

8. The signal transmission system according to claim 1, wherein the signal encoder has a mixer, by means of which a clocked signal is superimposed on the impressed current, which signal represents a serial data stream so that a modulated current is fed into the line.

9. The signal transmission system according to claim 8, wherein the control and evaluation unit has a comparator, wherein an input of the comparator is connected to a connection point between the load and the at least one electrical component, so that a serial data stream is captured via the load from the voltage change that occurs based on the modulated current.

10. The signal transmission system according to claim 9, wherein the microprocessor of the control and evaluation unit is connected to the output of the comparator or to the output of a Schmitt trigger that is downstream from the comparator.

11. The signal transmission system according to claim 1, wherein the range of the impressed current is between 4 and 20 mA.

12. A transducer for a signal transmission system, comprising:
a sensor for capturing a measured value, an electronic unit,
a power source, and
a comparator
wherein the transducer is able to provide an impressed current in a range between 4 and 20 mA to an output connector and which is proportional to the captured measured value,
wherein an input of the comparator is connected to the output connector, so that a serial data stream is derivable from a pulsing voltage that is present on the output connector.

13. The transducer according to claim 12, further comprising a Schmitt trigger that has an input connected to an output of the comparator.

14. The transducer according to claim 13, further comprising a microprocessor which is connected to the output of the comparator or to the output of the Schmitt trigger downstream from the comparator.

15. The transducer according to claim 13, further comprising a mixer which superimposes a clocked signal on the measured value captured by the sensor, the clocked signal representing a serial data stream, so that an amplitude-modulated current is provided at the output connector.

16. A control and evaluation unit for a signal transmission system, comprising:
a load that is connected to a signal input and
a microprocessor that captures and evaluates a voltage that drops across the load or a current that flows through the load,
wherein the load is connected in series to at least one electrical component, at which a direct current appears when a current flows through the electrical component,
wherein the at least one electrical component is bridgeable by a switch, and
wherein the microprocessor compares the voltage that drops across the load or the current that flows through the load when the electrical component is bridged to the voltage that drops across the load or the current that flows through the load when the electrical component is connected in series to the load and detects an error when a threshold is exceeded or fallen below.

17. The control and evaluation unit according to claim 16, wherein the switch is controlled by the microprocessor and the switching of the switch is carried out in a clocked manner, wherein the clock represents a preset serial data stream.

18. The control and evaluation unit according to claim 16, further comprising a comparator and a Schmitt trigger that is downstream from the comparator, wherein an input of the comparator is connected to a connection point between the load and the at least one electrical component, and wherein the microprocessor is connected to an output of the comparator or an output of the Schmitt trigger.

* * * * *